(12) United States Patent
Kakiuchi et al.

(10) Patent No.: US 10,357,971 B2
(45) Date of Patent: Jul. 23, 2019

(54) METHOD FOR MANUFACTURING LIQUID JETTING APPARATUS AND LIQUID JETTING APPARATUS

(71) Applicant: BROTHER KOGYO KABUSHIKI KAISHA, Nagoya-shi, Aichi-ken (JP)

(72) Inventors: Toru Kakiuchi, Aichi-ken (JP); Keita Hirai, Nagoya (JP)

(73) Assignee: BROTHER KOGYO KABUSHIKI KAISHA, Aichi-Ken (JP)

( * ) Notice: Subject to any disclaimer, the term of this patent is extended or adjusted under 35 U.S.C. 154(b) by 0 days.

(21) Appl. No.: 15/493,235

(22) Filed: Apr. 21, 2017

(65) Prior Publication Data

US 2017/0217183 A1    Aug. 3, 2017

Related U.S. Application Data

(62) Division of application No. 14/828,780, filed on Aug. 18, 2015, now Pat. No. 9,662,884.

(30) Foreign Application Priority Data

Sep. 8, 2014 (JP) ................................ 2014-181973

(51) Int. Cl.
*B41J 2/045* (2006.01)
*B41J 2/16* (2006.01)
(Continued)

(52) U.S. Cl.
CPC ......... *B41J 2/1612* (2013.01); *B41J 2/14233* (2013.01); *B41J 2/161* (2013.01);
(Continued)

(58) Field of Classification Search
None
See application file for complete search history.

(56) References Cited

U.S. PATENT DOCUMENTS 6,336,717 B1   1/2002   Shimada et al.
6,502,928 B1   1/2003   Shimada et al.
(Continued)

FOREIGN PATENT DOCUMENTS

CN    1681657      10/2005
CN    102825911    12/2012
(Continued)

OTHER PUBLICATIONS

Chinese Office Action for application No. 201510526288.0 dated Aug. 1, 2016.
(Continued)

*Primary Examiner* — Matthew Luu
*Assistant Examiner* — Tracey M McMillion
(74) *Attorney, Agent, or Firm* — Haug Partners LLP

(57) ABSTRACT

A method for manufacturing a liquid jetting apparatus includes: a wire formation step of forming a wire so that a part of the wire covers a piezoelectric film; and an electrode formation step of forming a second electrode, after the wire formation step, on a surface of the piezoelectric film on a side far from a vibration film so as to be in electrical conduction with the wire. The liquid jetting apparatus includes: a flow passage formation portion; and a piezoelectric actuator having the vibration film provided on the flow passage formation portion, the piezoelectric film arranged on the vibration film, a first electrode arranged on a surface of the piezoelectric film on a side near to the vibration film, the second electrode arranged on the surface of the piezoelectric film on the side far from the vibration film, and the wire connected to the second electrode.

12 Claims, 11 Drawing Sheets

(51) Int. Cl.
*B41J 2/14* (2006.01)
*H01L 41/053* (2006.01)
*H01L 41/09* (2006.01)
*H01L 41/187* (2006.01)
*H01L 41/316* (2013.01)
*H01L 41/318* (2013.01)
*H01L 41/332* (2013.01)

(52) U.S. Cl.
CPC ............ *B41J 2/1623* (2013.01); *B41J 2/1626* (2013.01); *B41J 2/1628* (2013.01); *B41J 2/1631* (2013.01); *B41J 2/1642* (2013.01); *B41J 2/1645* (2013.01); *B41J 2/1646* (2013.01); *H01L 41/0533* (2013.01); *H01L 41/0973* (2013.01); *H01L 41/1876* (2013.01); *H01L 41/316* (2013.01); *H01L 41/318* (2013.01); *H01L 41/332* (2013.01); *B41J 2002/14491* (2013.01)

(56) References Cited

U.S. PATENT DOCUMENTS

| | | | |
|---|---|---|---|
| 7,686,421 B2 | 3/2010 | Yasoshima et al. | |
| 8,551,692 B1* | 10/2013 | De Brabander | B41J 2/14233 216/27 |
| 8,556,396 B2 | 10/2013 | Kato et al. | |
| 2006/0152548 A1 | 7/2006 | Yasoshima et al. | |
| 2007/0048880 A1 | 3/2007 | Kobayashi et al. | |
| 2008/0297567 A1* | 12/2008 | Min | B41J 2/14129 347/64 |
| 2009/0244203 A1* | 10/2009 | Mita | B41J 2/14233 347/68 |
| 2011/0037813 A1 | 2/2011 | Nakatani | |
| 2011/0090291 A1 | 4/2011 | Hirai | |
| 2012/0005871 A1* | 1/2012 | Hirai | B41J 2/14233 29/25.35 |
| 2012/0236083 A1* | 9/2012 | Mizukami | B41J 2/14274 347/70 |
| 2012/0320131 A1 | 12/2012 | Kato et al. | |
| 2013/0286106 A1 | 10/2013 | Deguchi et al. | |

FOREIGN PATENT DOCUMENTS

| | | |
|---|---|---|
| EP | 1 997 635 | 12/2008 |
| EP | 2 535 189 | 12/2012 |
| JP | 2000-211134 | 8/2000 |
| JP | 2004-160947 | 6/2004 |
| JP | 3852560 | 9/2006 |
| JP | 2007-59705 | 3/2007 |
| JP | 2011-83995 | 4/2011 |

OTHER PUBLICATIONS

Extended European Search Report for Application No. 15182398.6 dated Jun. 22, 2016.

Office Action for European Patent Application No. 15182398.6 dated Jun. 18, 2018.

Notice of Reasons for Rejection for Japanese Application No. 2014-181973 dated Aug. 28, 2018

* cited by examiner

METHOD FOR MANUFACTURING LIQUID JETTING APPARATUS AND LIQUID JETTING APPARATUS

CROSS REFERENCE TO RELATED APPLICATION

The present application is a divisional of U.S. patent application Ser. No. 14/828,780 filed on Aug. 18, 2015, which claims priority from Japanese Patent Application No. 2014-181973 filed on Sep. 8, 2014, the disclosures of which are incorporated herein by reference in their entirety.

BACKGROUND

Field of the Invention

The present teaching relates to a method for manufacturing a liquid jetting apparatus, and to the liquid jetting apparatus.

Description of the Related Art

Japanese Patent No. 3852560 discloses an ink jet head as a liquid jetting apparatus. This ink jet head has a flow passage formation substrate formed with ink flow passages such as a plurality of pressure chambers and the like in communication with a plurality of nozzles respectively, and a plurality of piezoelectric elements provided on the flow passage formation substrate to correspond to the plurality of pressure chambers respectively.

The plurality of piezoelectric elements are arranged on an elastic film formed on the flow passage formation substrate to cover the plurality of pressure chambers. Each of the piezoelectric elements includes a piezoelectric film, a lower electrode film arranged on a side near to the flow passage formation substrate (lower side) with respect to the piezoelectric film, and an upper electrode film arranged on another side far from the flow passage formation substrate with respect to the piezoelectric film. Wires (lead electrodes) are provided to extend on the elastic film such that their end portions on one side are arranged to cover the upper surfaces of the upper electrode films to be connected with the upper electrode films.

The piezoelectric elements mentioned above are manufactured through the following steps. First, the lower electrode film of the piezoelectric elements is formed on the elastic film. Next, the piezoelectric film and the upper electrode film are formed and etched to pattern the piezoelectric elements. Next, after an electroconductive film is formed on an entire surface of the flow passage formation substrate, the electroconductive film is patterned for each of the piezoelectric elements to form the plurality of wires.

SUMMARY

According to Japanese Patent No. 3852560, first the upper electrode films are formed on the upper surfaces of the piezoelectric films, and the wires are formed on tops of the upper electrode films to be connected therewith. From the point of view of piezoelectric property, precious metals such as Pt, Ir and the like are often used for the upper electrode films and, generally, the electrodes of those precious metals are difficult to adhere to the piezoelectric films. In such cases, due to various causes during the manufacturing of the ink jet head, the upper electrode films may be partly detached from the upper surfaces of the piezoelectric films, and/or reduced in film thickness.

For example, depending on the method for forming the electroconductive film to later become the plurality of wires, the electroconductive film may have a great tensile stress. The great tensile stress is liable to act on the upper electrode films under the electroconductive film in such a direction as to draw and detach the upper electrode films and, as a result, to detach both the electroconductive film and the upper electrode films. Further, such detachment caused by the stress may also become conspicuous quite often after the passage of a long time even if it does not occur immediately after the ink jet head is manufactured.

Further, a heating step may be carried out for various purposes during or after the formation of the wires. Such heating step causes a thermal stress to be generated between the upper electrode films and the wires. Hence, also because of this, the upper electrode films are more likely to be exfoliated. Especially, for the wires to be less likely to break, it is common to form the electroconductive film to later become the wires at a greater thickness than the upper electrode films. Accordingly, the thicker the electroconductive film, the more likely for the upper electrode films to be exfoliated due to the thermal stress generated between the electroconductive film and the upper electrode films.

Further, if the upper electrode films are formed first and then the wires are formed thereon, the film thickness of the upper electrode films may be thinned because the upper electrode films under the electroconductive film may be partly removed along with the electroconductive film during etching of the electroconductive film for forming the wires.

It is an object of the present teaching to maximally prevent the exfoliation or reduction in film thickness of the electrodes due to the step(s) after forming the electrodes on the piezoelectric films.

According to a first aspect of the present teaching, there is provided a method for manufacturing a liquid jetting apparatus including: a flow passage formation portion in which a pressure chamber is formed to communicate with a nozzle; and a piezoelectric actuator having a vibration film provided on the flow passage formation portion to cover the pressure chamber, a piezoelectric film arranged on the vibration film to correspond to the pressure chamber, a first electrode arranged on a surface of the piezoelectric film on a side near to the vibration film, a second electrode arranged on another surface of the piezoelectric film on a side far from the vibration film, and a wire connected to the second electrode, the method including: a wire formation step of forming the wire so that a part of the wire overlaps with the piezoelectric film; and an electrode formation step of forming the second electrode, after the wire formation step, on another surface of the piezoelectric film on the side far from the vibration film so as to be in electrical conduction with the wire.

According to the present teaching, after the wire is formed to overlap with the piezoelectric film, the second electrode is formed on the piezoelectric film to be in electrical conduction with the wire. That is, since the second electrode is formed after the wire is formed, there is no occurring of such a problem that the second electrode is exfoliated or the second electrode is reduced in film thickness after formation of the wire. Further, in the present teaching, the wire formed to overlap with the piezoelectric film may directly contact with the piezoelectric film. However, the present teaching is not limited to that. Another layer may intervene between the piezoelectric film and the wire.

According to a second aspect of the present teaching, there is provided a liquid jetting apparatus including: a flow passage formation portion in which a pressure chamber is formed to communicate with a nozzle; and a piezoelectric actuator provided on the flow passage formation portion, wherein the piezoelectric actuator has: a vibration film provided on the flow passage formation portion to cover the pressure chamber; a piezoelectric film arranged on the vibration film; a first electrode arranged on a surface of the piezoelectric film on a side near to the vibration film; a second electrode arranged on another surface of the piezoelectric film on a side far from the vibration film; and a wire connected to the second electrode and formed so that a part of the wire overlaps with the piezoelectric film, wherein on the surface of the piezoelectric film on the side far from the vibration film, the second electrode is formed to overlap with the wire.

Depending on the film formation method for forming an electroconductive film which will later become a plurality of wires, a great tensile stress may remain in the electroconductive film after formation thereof. If the second electrode is present under the wires, then the remaining tensile stress in the wires is liable to act in such a direction as to detach the second electrode under the wires, thereby exfoliating the second electrode. In this regard, the second electrode is formed over the wire after the wire is formed to partly overlap with the piezoelectric film, according to the present teaching. By virtue of this, the second electrode overlaps with the wire on the surface of the piezoelectric film on the side far from the vibration film. Therefore, the second electrode receives a smaller stress from the wire. Thus, even after the passage of a long time, such a problem is still less likely to occur that the second electrode may be exfoliated.

BRIEF DESCRIPTION OF THE DRAWINGS

FIGS. 6A to 6E depict some steps of manufacturing the ink jet head, wherein FIG. 6A depicts a step of forming a vibration film, FIG. 6B depicts a step of forming a common electrode, FIG. 6C depicts a step of forming a film made of piezoelectric materials, FIG. 6D depicts a step of forming piezoelectric films, and FIG. 6E depicts a step of forming communicating holes.

FIGS. 7A to 7E depict other steps of manufacturing the ink jet head, wherein FIG. 7A depicts a step of forming a first protective film, FIG. 7B depicts a step of forming an insulating film, FIG. 7C depicts a step of forming an electroconductive film for wires, FIG. 7D depicts a step of forming the wires (etching the electroconductive film), and FIG. 7E depicts a step of forming a second protective film.

FIGS. 8A to 8D depict still other steps of manufacturing the ink jet head, wherein FIG. 8A depicts a step of thinning a flow passage formation portion, FIG. 8B depicts a step of attaching a supporting member, FIG. 8C depicts a step of etching the insulating film and the second protective film, and FIG. 8D depicts a step of etching the first protective film.

FIGS. 9A to 9D depict still other steps of manufacturing the ink jet head, wherein FIG. 9A depicts a step of forming an electroconductive film for individual electrodes, FIG. 9B depicts a step of forming the individual electrodes (etching the electroconductive film), FIG. 9C depicts a step of etching the flow passage formation portion, and FIG. 9D depicts a step of joining a reservoir formation member.

DESCRIPTION OF THE EMBODIMENT

Figure 1:
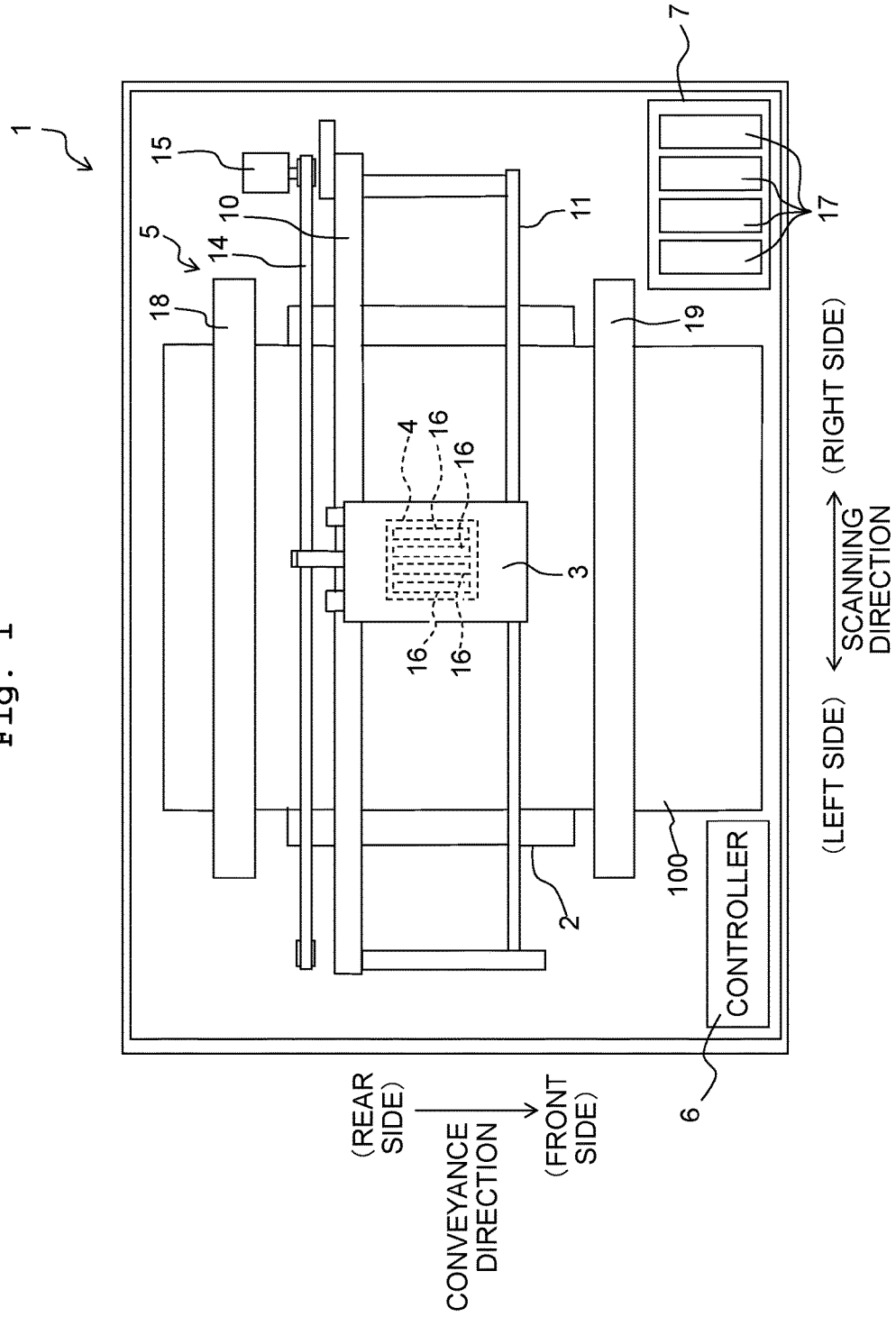
FIG. 1 is a schematic plan view of a printer in accordance with an embodiment of the present teaching.

Next, an embodiment of the present teaching will be explained. First, referring to FIG. 1, a schematic configuration of an ink jet printer 1 will be explained. Further, the front, rear, left and right directions depicted in FIG. 1 are defined as "front", "rear", "left" and "right" of the printer, respectively. Further, the near side of the page of FIG. 1 is defined as "upper side" or "upside", while the far side of the page is defined as "lower side" or "downside". The following explanation will be made while appropriately using the directional terms of front, rear, left, right, upside, and downside.

<A Schematic Configuration of the Printer>

As depicted in FIG. 1, the ink jet printer 1 includes a platen 2, a carriage 3, an ink jet head 4, a conveyance mechanism 5, a controller 6, etc.

On the upper surface of the platen 2, a sheet of recording paper 100 which is a recording medium is placed. The carriage 3 is configured to be movable reciprocatingly in a left-right direction (also referred to below as a scanning direction) along two guide rails 10 and 11 in a region facing the platen 2. An endless belt 14 is linked to the carriage 3, and a carriage drive motor 15 drives the endless belt 14 whereby the carriage 3 moves in the scanning direction.

The ink jet head 4 is installed in the carriage 3 to move in the scanning direction together with the carriage 3. The ink jet head 4 includes four head units 16 arranged in the scanning direction. The four head units 16 are connected, respectively via unshown tubes, with a cartridge holder 7 in which ink cartridges 17 retaining inks of four colors (black, yellow, cyan, and magenta) respectively are installed. Each of the head units 16 has a plurality of nozzles 24 (see FIGS. 2 to 5) formed in its lower surface (the surface on the far side of the page of FIG. 1). The inks supplied from the ink cartridges 17 are jetted from the nozzles 24 of the head units 16 toward the recording paper 100 placed on the platen 2.

The conveyance mechanism 5 has two conveyance rollers 18 and 19 arranged to interpose the platen 2 therebetween in a front-rear direction. With the two conveyance rollers 18 and 19, the conveyance mechanism 5 conveys the recording paper 100 placed on the platen 2 forward (in the following, also referred to as a conveyance direction).

The controller 6 is provided with a ROM (Read Only Memory), a RAM (Random Access Memory), an ASIC (Application Specific Integrated Circuit) including various types of control circuits, etc. In accordance with programs stored in the ROM, the controller 6 controls the ASIC to execute various processes such as printing on the recording paper 100 and the like. For example, in a printing process, based on a print command inputted from an external device such as a PC or the like, the controller 6 controls the ink jet head 4, the carriage drive motor 15 and the like to print image and the like on the recording paper 100. In particular, the controller 6 causes those members to alternately perform an ink jet operation to jet the inks while moving the ink jet head 4 together with the carriage 3 in the scanning direction, and a conveyance operation to let the conveyance rollers 18 and 19 convey the recording paper 100 in the conveyance direction by a predetermined distance.

<Details of the Ink Jet Head>

Next, referring to FIGS. 2 to 5, a detailed configuration of the ink jet head 4 will be explained. Further, because all of the four head units 16 of the ink jet head 4 have the same configuration, one of the four will be explained, and explanation for the other head units 16 be omitted.

As depicted in FIGS. 2 to 5, the head unit 16 includes a nozzle plate 20, a flow passage formation portion 21, a piezoelectric actuator 22, and a reservoir formation member 23. Further, in order to simplify FIG. 2, only an external form is drawn with a two-dot chain line to depict the reservoir formation member 23 positioned above the flow passage formation portion 21 and the piezoelectric actuator 22.

<The Nozzle Plate>

Figure 2:
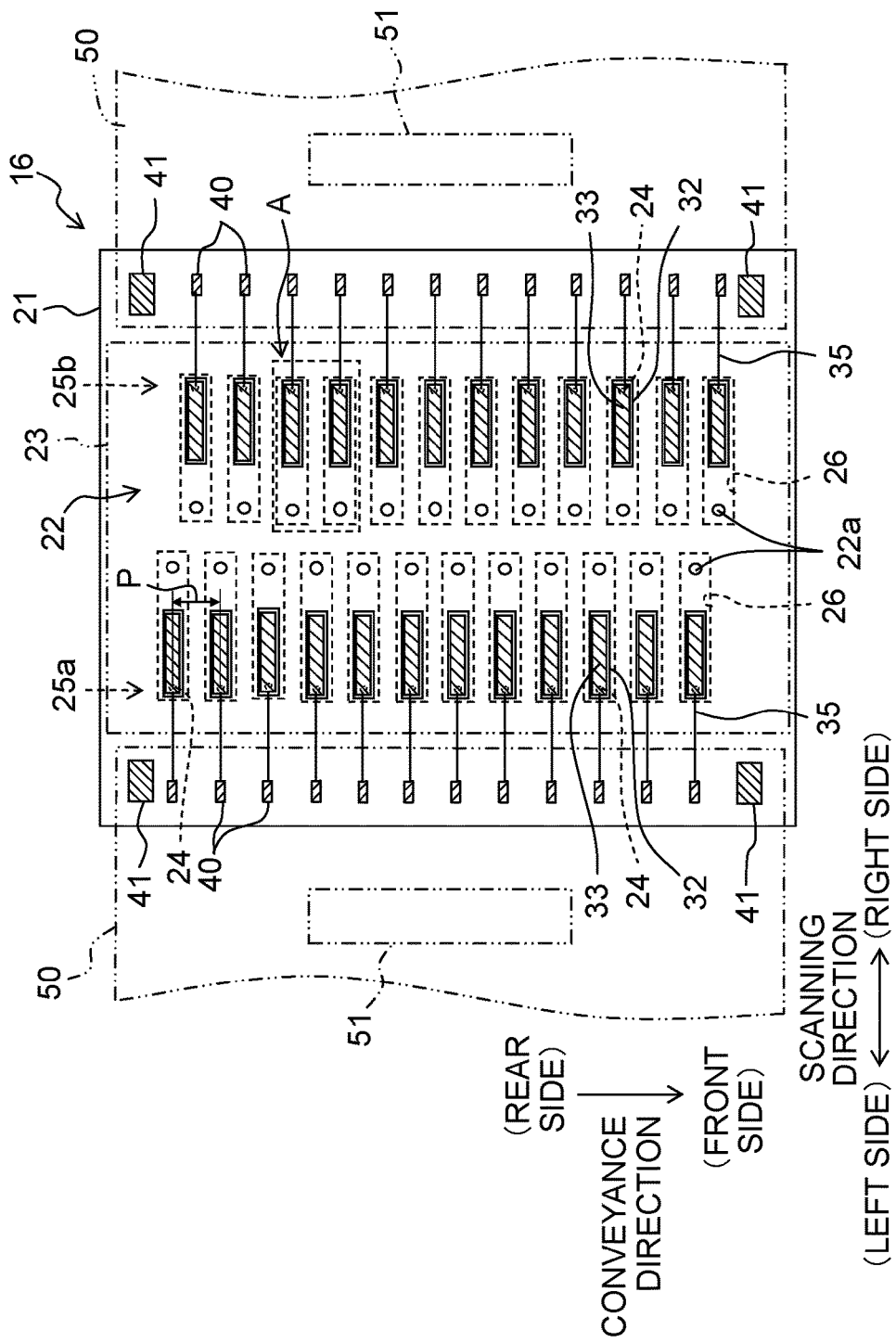
FIG. 2 is a top view of one head unit of an ink jet head.

The nozzle plate 20 is not limited to any particular material. It is possible to adopt various materials therefor, for example: metallic materials such as stainless steel; silicon; and synthetic resin materials such as polyimide. A plurality of nozzles 24 are formed in the nozzle plate 20. As depicted in FIG. 2, the plurality of nozzles 24 for jetting the ink of one color are aligned in the conveyance direction to form two nozzle rows 25a and 25b arranged in the left-right direction. In the two nozzle rows 25a and 25b, the nozzles 24 deviate in position according to the conveyance direction by half the arrangement pitch P (P/2) of each nozzle row 25.

<Flow Passage Formation Portion>

The nozzle plate 20 is jointed to the lower surface of a flow passage substrate 80 made of silicon. The flow passage substrate 80 has a structure in which the flow passage formation portion 21 formed with a plurality of pressure chambers 26 and a vibration film 30 of the aftermentioned piezoelectric actuator 22 are integrated. The flow passage formation portion 21 occupies a great part of the flow passage substrate 80 and has the plurality of pressure chambers 26 formed in respective communication with the plurality of nozzles 24. Each of the pressure chambers 26 has a planar shape of a rectangle elongated in the scanning direction. The plurality of pressure chambers 26 are aligned in the conveyance direction corresponding to the nozzle row of the aforementioned plurality of nozzles 24.

<The Piezoelectric Actuator>

The piezoelectric actuator 22 imparts jetting energy to the inks in the plurality of pressure chambers 26 to jet the inks from the nozzles 24. The piezoelectric actuator 22 is arranged on the upper surface of the flow passage formation portion 21. As depicted in FIGS. 2 to 5, the piezoelectric actuator 22 has a structure in which a plurality of film layers of the vibration film 30, a common electrode 31, a plurality of piezoelectric films 32, a first protective film 34, a plurality of individual electrodes 33, a plurality of wires 35, an insulating film 36, a second protective film 37, and the like are stacked. Further, in FIG. 2, illustration of the first protective film 34 covering the piezoelectric films 32 and the second protective film 37 covering the wires 35 is omitted. As will be explained later on, the plurality of films constituting the piezoelectric actuator 22 are formed and etched on the upper surface of the flow passage substrate 80 of silicon, by way of a publicly known semiconductor processing technology.

Figure 3:
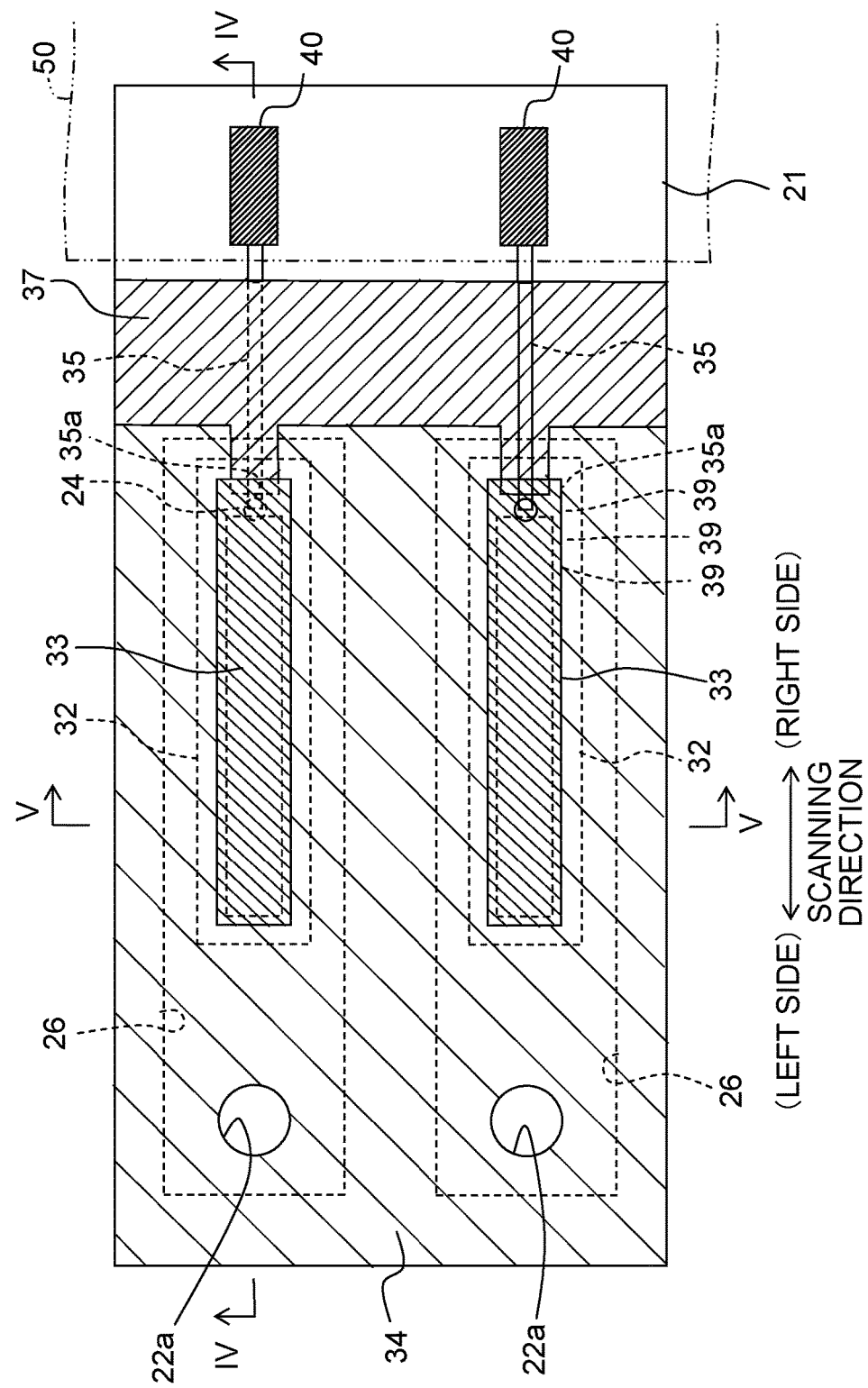
FIG. 3 is an enlarged view of part A in FIG. 2.

As depicted in FIGS. 2 and 3, a plurality of communicating holes 22a are formed in the piezoelectric actuator 22 at positions overlapping respectively with end portions of the plurality of pressure chambers 26. By virtue of these plurality of communicating holes 22a, flow passages in the aftermentioned reservoir formation member 23 are in respective communication with the plurality of pressure chambers 26.

The vibration film 30 is arranged on the entire area of the upper surface of the flow passage formation portion 21 to cover the plurality of pressure chambers 26. Further, in this embodiment as described earlier on, the vibration film 30 is integrated with the flow passage formation portion 21. The vibration film 30 is formed of silicon dioxide ($SiO_2$), silicon nitride ($SiN_x$), or the like. The vibration film 30 is as thick as, for example, 1 μm or so.

The common electrode 31 is formed of an electroconductive material. The common electrode 31 is formed on almost entire area of the upper surface of the vibration film 30 and arranged across the plurality of pressure chambers 26. While the common electrode 31 is not limited to any particular material, it is possible to adopt, for example, a two-layer structure of platinum (Pt) and titanium (Ti). In such a case, it is possible to form the platinum layer at 200 nm or so and the titanium layer at 50 nm or so.

The plurality of piezoelectric films 32 are formed on the upper surface of the vibration film 30 via the common electrode 31. Further, the plurality of piezoelectric films 32 may be coupled with each other. In such a case, slits may be formed between the plurality of piezoelectric films 32 of the piezoelectric material layer where the plurality of piezoelectric films 32 are integrated. The plurality of piezoelectric films 32 are arranged to correspond to the plurality of pressure chambers 26, respectively. That is, the plurality of piezoelectric films 32 are arranged to overlap with the plurality of pressure chambers 26, respectively. As depicted in FIG. 3, each of the piezoelectric films 32 has a planar shape of a rectangle which is one size smaller than the pressure chamber 26 and elongated in the scanning direction. Each of the piezoelectric films 32 is arranged to face a central portion of the corresponding pressure chamber 26. The piezoelectric films 32 are formed of, for example, a piezoelectric material composed primarily of lead zirconate titanate (PZT) which is a mixed crystal of lead titanate and lead zirconate. The piezoelectric films 32 are as thick as, for example, 1 μm or so. Further, the piezoelectric films 32 formed of PZT are preferentially oriented in, for example, (100) direction.

Figure 4:
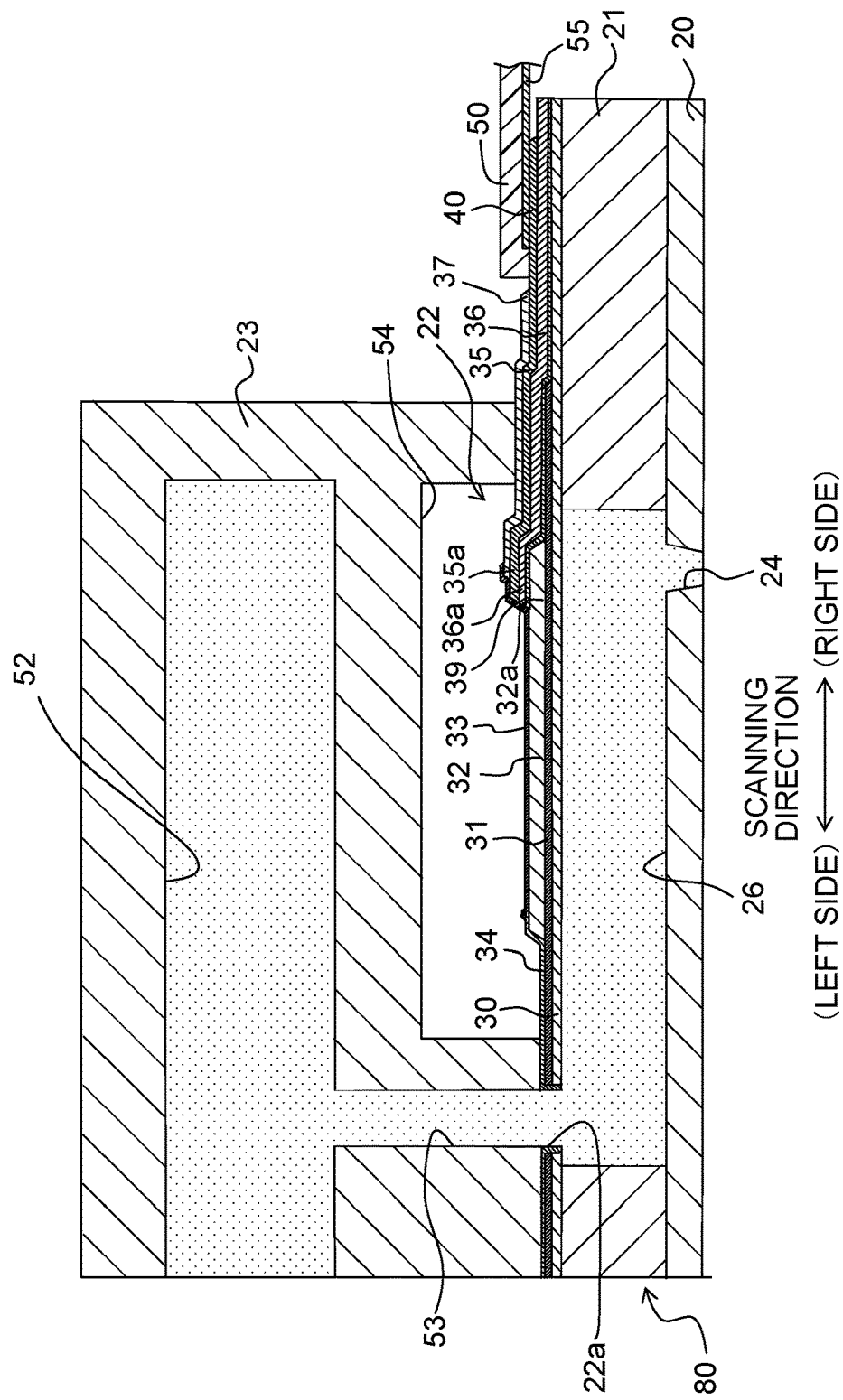
FIG. 4 is a cross-sectional view taken along the line IV-IV in FIG. 3.
Figure 5:
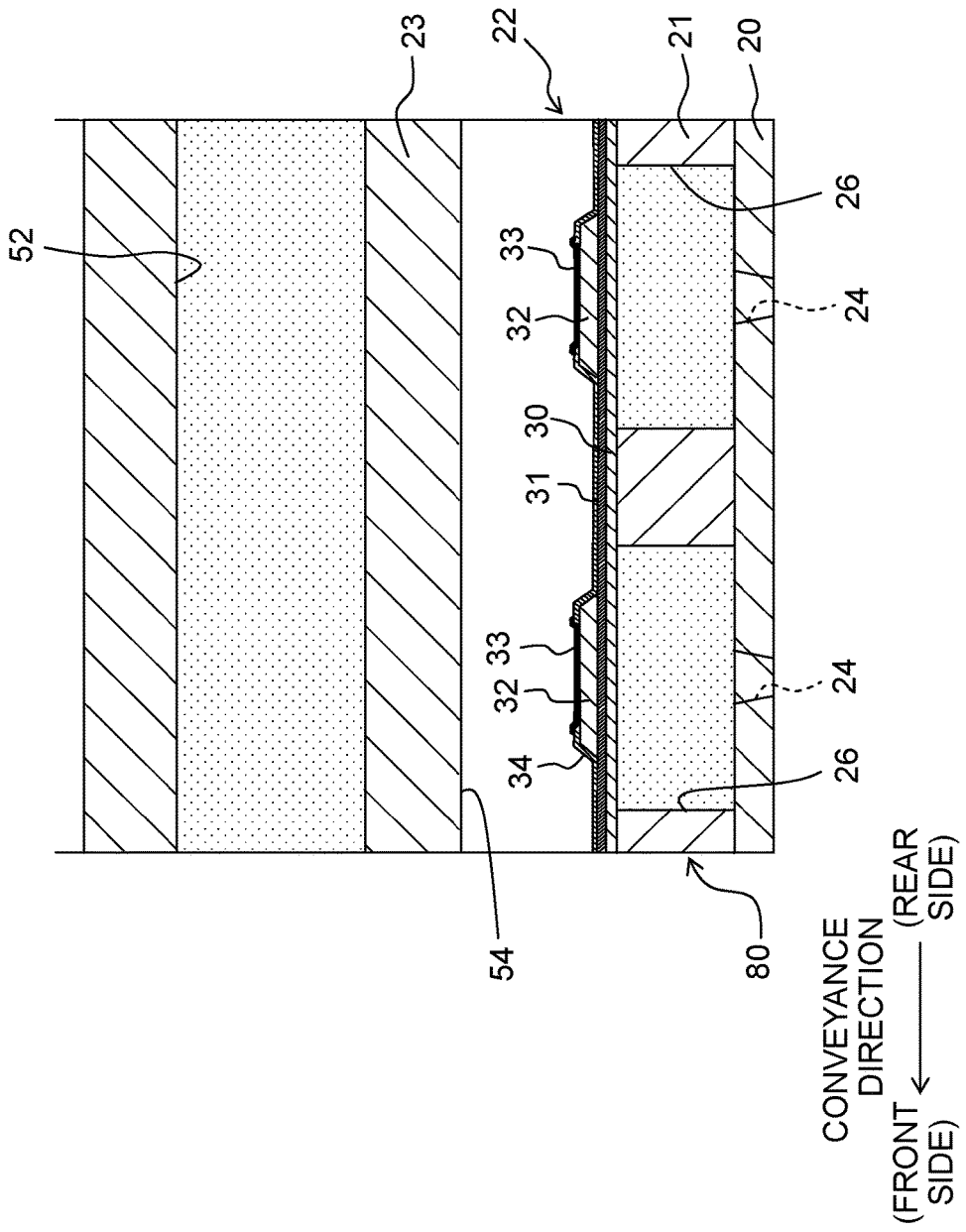
FIG. 5 is a cross-sectional view taken along the line V-V in FIG. 3.

As depicted in FIGS. 3 to 5, the first protective film 34 is formed to cover edge portions of the plurality of piezoelectric films 32, and at least such parts of the common electrode 31 as exposed from the piezoelectric films 32. Further, a central portion of each of the piezoelectric films 32 is exposed from the first protective film 34, and the individual electrodes 33 are arranged in those exposed areas. The first protective film 34 serves for preventing moisture contained in the air from coming into the piezoelectric films 32. The first protective film 34 is formed of a waterproof material such as alumina ($Al_2O_3$). The first protective film 34 is as thick as, for example, 100 nm or so.

Each of the individual electrodes 33 has a planar shape of a rectangle which is one size smaller than the piezoelectric film 32. Each of the individual electrodes 33 is formed on the upper surface of the piezoelectric film 32 at the central portion which is exposed from the first protective film 34. The individual electrodes 33 are formed of, for example, platinum (Pt), iridium (Ir), or the like. The individual electrodes 33 are as thick as, for example, 100 nm or so.

The aforementioned piezoelectric films 32 are interposed between the common electrode 31 arranged on their lower side (the near side to the vibration film 30), and the individual electrodes 33 arranged on their upper side (the far side from the vibration film 30). Further, the piezoelectric films 32 are polarized downwardly in thickness direction thereof, that is, polarized in the direction from the individual electrodes 33 toward the common electrode 31.

As depicted in FIGS. 4 and 5, the insulating film 36 is formed on the first protective film 34 at an end portion of the flow passage formation portion 21 in the left-right direction (the end portion on the right side in FIG. 4). Further, an end portion 36a of the insulating film 36 is arranged to overlap with the upper surface of an end portion 32a of the piezoelectric film 32 via the first protective film 34. The plurality of wires 35, which will be described next, are arranged on the insulating film 36. The common electrode 31 and the plurality of wires 35 are electrically insulated by the insulating film 36. Without being limited to any particular material, the insulating film 36 is formed of, for example, silicon dioxide ($SiO_2$). Further, from the point of view of insulation, it is preferable for the insulating film 36 to have a certain film thickness or more such as from 300 nm to 500 nm. The end portion 36a of the insulating film 36 overlaps with the piezoelectric film 32, while end portion of the individual electrode 33 overlaps with the end portion 36a of the insulating film 36. Further, the end portion 36a of the insulating film 36 also overlaps with the pressure chamber 26.

On the insulating film 36, the plurality of wires 35 are formed in respective connection with the plurality of individual electrodes 33. The plurality of wires 35 are formed of an electroconductive material such as aluminum (Al). Each of the wires 35 is arranged so that one end portion thereof overlaps with the upper surface of the end portion 32a of the piezoelectric film 32 via the first protective film 34 and insulating film 36, and is connected to the individual electrode 33 formed on the upper surface of the piezoelectric film 32. Further, each of the wires 35 extends in the scanning direction from the individual electrode 33. In more detail, as depicted in FIG. 2, the wires 35 connected to the individual electrodes 33 arranged on the left side extend leftward from the corresponding individual electrodes 33, while the wires 35 connected to the individual electrodes 33 arranged on the right side extend rightward from the corresponding individual electrodes 33. Further, in order to prevent any occurrence of wire breakage and the like as much as possible, it is preferable for the wires 35 to have a certain thickness (height) or more. In this embodiment, the wires 35 are as thick as, for example, 1 μm or so, being much thicker than the individual electrodes 33 (100 nm, for example).

Further, in this embodiment, as depicted in FIGS. 3 and 4, end portion 35a of the wire 35 overlaps with the piezoelectric film 32 while the end portion of the individual electrode 33 overlaps with the end portion 35a of the wire 35. Further, the end portion 35a of the wire 35 also overlaps with the pressure chamber 26. In this structure, even if a tensile stress generated during the formation of the wires 35 is remained in the wires 35, as compared with a case of the individual electrode 33 being present under the wire 35, the individual electrode 33 receives a smaller stress from the wire 35. Therefore, even after the passage of a long time, such a problem is still less likely to occur that the individual electrodes 33 may be exfoliated. Further, while this configuration is obtained by forming the wires 35 and then forming the individual electrodes 33 in manufacturing process of the piezoelectric actuator 22, the reason thereof will be described in detail in the course of explaining manufacturing steps later on.

Further, as depicted in FIG. 4, the end portion 35a of the wire 35 overlapping with the piezoelectric film 32 has a lateral surface 39 which forms a slope. Further, although only the lateral surface 39 of the end portion 35a on the left is depicted in FIG. 4, another lateral surface 39 on the near side (front side) of the page of FIG. 4, and still another lateral surface 39 on the far side (rear side) of the page of FIG. 4 also form slopes, respectively. Then, as depicted in FIGS. 3 and 4, the individual electrode 33 covers the three inclined lateral surfaces 39 of the end portion 35a of the wire 35. This configuration has increased the reliability of electrical connection between the wire 35 and the individual electrode 33.

The insulating film 36 under the wires 35 extends up to both the left and right ends of the flow passage formation portion 21. Then, as depicted in FIG. 2, in two end portions of the flow passage formation portion 21 on the left and right, a plurality of drive contact portions 40 are arranged on the insulating film 36 to align in the conveyance direction. The wires 35 drawn out leftward from the individual electrodes 33 are connected with the drive contact portions 40 positioned at the left end portion of the flow passage formation portion 21, while the wires 35 drawn out rightward are connected with the drive contact portions 40 positioned at the right end portion of the flow passage formation portion 21. Further, for each of the left and right end portions of the flow passage formation portion 21, two ground contact portions 41 are also arranged to connect with the common electrode 31 respectively at both sides of the plurality of drive contact portions 40 in the conveyance direction.

The second protective film 37 is formed from the vibration film 30 to the plurality of piezoelectric films 32 to cover the plurality of wires 35 mentioned above. The second protective film 37 is provided for the purposes of protecting the plurality of wires 35, securing the insulation between the plurality of wires 35, and the like. Further, an end portion of the second protective film 37 overlaps with the piezoelectric film 32, while the end portion of the individual electrode 33 overlaps with the end portion of the second protective film 37. Further, the end portion of the second protective film 37 also overlaps with the pressure chamber 26. Further, although illustration of the second protective film 37 is omitted in FIG. 2, the second protective film 37 is formed to cover each of the wires 35 from the parts connected with the individual electrodes 33 to the parts connected with the drive contact portions 40, while the plurality of the drive contact portions 40 and the ground contact portions 41 are exposed from the second protective film 37. The second protective film 37 is formed of, for example, silicon nitride ($SiN_x$) or the like.

As depicted in FIG. 2, two wiring members of COF (Chip On Film) 50 are joined respectively to the upper surface of the left end portion and the upper surface of the right end portion of the piezoelectric actuator 22 described earlier on. Then, as depicted in FIG. 4, a plurality of wires 55 formed in each COF 50 are electrically connected with the plurality of drive contact portions 40, respectively. The controller 6 (see FIG. 1) of the printer 1 is connected to the other end of each COF 50 than the end connected with the drive contact portion 40. Further, a driver IC 51 is mounted on each COF 50.

Based on a control signal transmitted from the controller 6, each driver IC 51 generates and outputs a drive signal for driving the piezoelectric actuator 22. The drive signal outputted from the driver IC 51 is inputted to the drive contact portions 40 via the wires 55 of the COF 50 and, further, supplied to the respective individual electrodes 33 via the wires 35 of the piezoelectric actuator 22. The individual electrodes 33 supplied with the drive signal change in potential between a predetermined drive potential and a ground potential. Further, each COF 50 is also formed with ground wires (not depicted), and the ground wires are connected electrically with the ground contact portions 41 of the piezoelectric actuator 22. By virtue of this, the common electrode 31 connected with the ground contact portions 41 is constantly kept at the ground potential.

The following explanation will be made on an operation of the piezoelectric actuator 22 when supplied with the drive signal from the driver IC 51. Without being supplied with the drive signal, the individual electrodes 33 stay at the ground potential and thus have the same potential as the common electrode 31. From this state, if the drive signal is supplied to any one of the individual electrodes 33 to apply the drive potential to that individual electrode 33, then due to the potential difference between that individual electrode 33 and the common electrode 31, is acted on by an electric field acts on the corresponding piezoelectric film 32 in a direction parallel to a thickness direction thereof. On this occasion, because the polarization direction of the piezoelectric film 32 conforms to the direction of the electric field, the piezoelectric film 32 extends in the thickness direction which is the polarization direction thereof, and contracts in a planar direction thereof. Along with the contraction deformation of the piezoelectric film 32, the vibration film 30 is bent to project toward the pressure chamber 26. By virtue of this, the pressure chamber 26 decreases in volume to generate a pressure wave inside the pressure chamber 26, thereby jetting liquid droplets of the ink from the nozzle 24 in communication with the pressure chamber 26.

<The Reservoir Formation Member>

As depicted in FIGS. 4 and 5, the reservoir formation member 23 is arranged on an opposite side (the upper side) of the flow passage formation portion 21 with respect to the piezoelectric actuator 22 with the piezoelectric actuator 22 intervening therebetween, and joined to the upper surface of the piezoelectric actuator 22 by way of adhesive. While the reservoir formation member 23 may be formed of silicon as with the flow passage formation portion 21, it may also be formed of other materials than silicon such as a metallic material or a synthetic resin material.

The reservoir formation member 23 has an upper half portion formed with a reservoir 52 extending in the conveyance direction. The reservoir 52 is connected with the cartridge holder 7 (see FIG. 1) in which the ink cartridges 17 are installed through tubes which are not depicted.

As depicted in FIG. 4, the reservoir formation member 23 has a lower half portion formed with a plurality of ink supply flow passages 53 extending downward from the reservoir 52. The ink supply flow passages 53 are communicated with the plurality of communicating holes 22a of the piezoelectric actuator 22, respectively. By virtue of this, the inks are supplied from the reservoir 52 to the plurality of pressure chambers 26 of the flow passage formation portion 21 via the plurality of ink supply flow passages 53 and the plurality of communicating holes 22a. Further, a protective cover portion 54 is also formed in the lower half portion of the reservoir formation member 23. The plurality of piezoelectric films 32 of the piezoelectric actuator 22 are contained in the inner space of the protective cover portion 54, and the plurality of piezoelectric films 32 are covered by the protective cover portion 54.

Next, referring to FIGS. 6A to 9D, an explanation will be made on steps of manufacturing the aforementioned head unit 16 of the ink jet head 4 and, in particular, focused on the step of manufacturing the piezoelectric actuator 22. FIGS. 6A to 9D explanatory diagrams of manufacturing steps of the ink jet head.

Figure 6A:
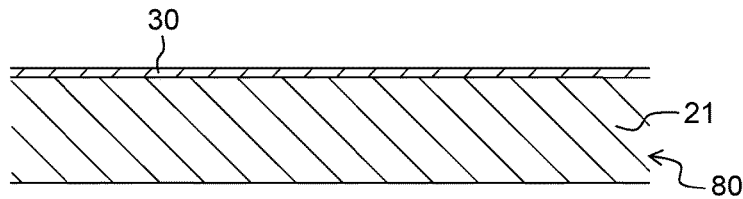
Figure 6B:
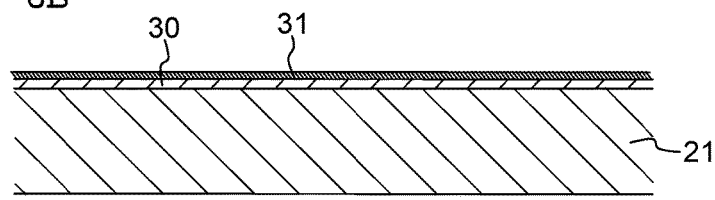

First, as depicted in FIG. 6A, the vibration film 30 of silicon dioxide is formed on a surface of the flow passage substrate 80 made of silicon. As a film formation method for the vibration film 30, it is possible to adopt thermal oxidation processing as preferred. Next, as depicted in FIG. 6B, the common electrode 31 is formed as a film on the vibration film 30 by way of sputtering or the like.

Figure 6C:
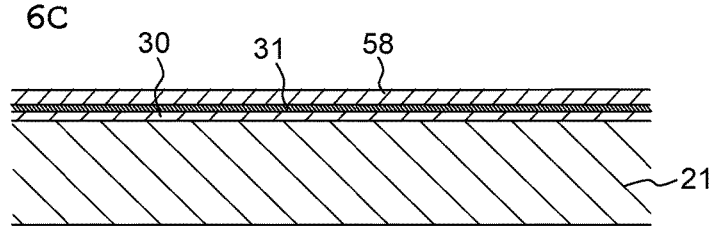
Figure 6D:
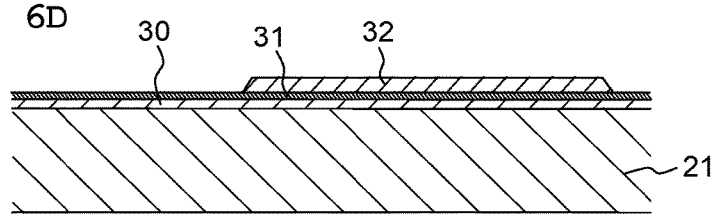
Figure 6E:
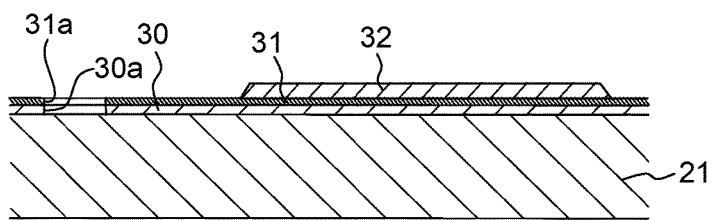

Next, the piezoelectric films 32 are formed on the common electrode 31. First, as depicted in FIG. 6C, a film 58, which is made of a piezoelectric material such as PZT or the like, is formed on the entire area of the upper surface of the common electrode 31, by way of sol-gel method, sputtering, or the like. Then, as depicted in FIG. 6D, an etching process is performed to remove the film 58 except for the parts facing the pressure chambers 26. Thereafter, as depicted in FIG. 6E, the vibration film 30 and common electrode 31 are etched to form holes 30a and 31a which become the communicating holes 22a of the piezoelectric actuator 22 (see FIG. 4) later.

Figure 7A:
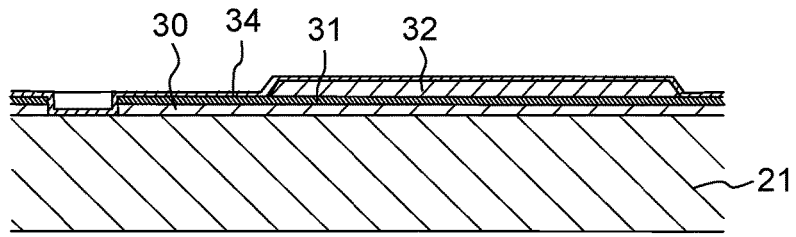
Figure 7B:
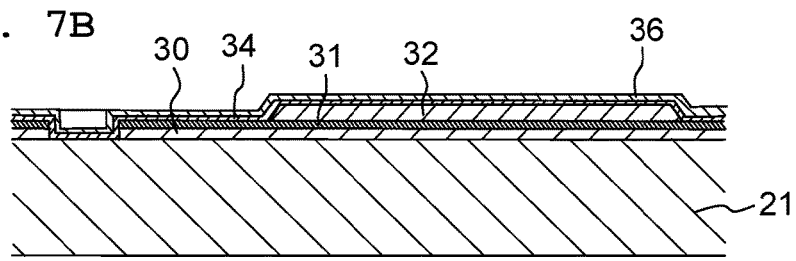

As depicted in FIG. 7A, the first protective film 34 is formed on the upper surface of the vibration film 30 (common electrode 31) by way of sputtering, atomic layer deposition (ALD) or the like, to cover the entire upper surfaces of the piezoelectric films 32. Further, as depicted in FIG. 7B, the insulating film 36 is formed on the first protective film 34 to entirely cover the piezoelectric films 32. It is possible to form the insulating film 36 made of silicon dioxide by way of plasma CVD as preferred. Further, in order to form a film of good quality, it is necessary to perform the plasma CVD by keeping a temperature of a silicon substrate at at least 200° C. or above, usually, at a temperature of 300° C. or above. Further, without being limited to the plasma CVD mentioned above, it is also possible to form the insulating film 36 by way of another film formation method such as spin coating method to form a SOG (Spin On Glass) film, etc. If the insulating film 36 is formed by way of the spin coating method, then after a film formation material is applied by the spin coating, the flow passage substrate 80 of silicon is heated at 300° C. or so. Further, other than the above film formation methods, it is also possible to form the insulating film 36 by way of atomic layer deposition (ALD).

After forming the insulating film 36, the plurality of wires 35 are formed on the insulating film 36. Further, at this stage, the individual electrodes 33 have not yet been formed on the piezoelectric films 32. That is, in this embodiment, the wires 35 to be connected with the individual electrodes 33 are formed before forming the individual electrodes 33.

Figure 7C:
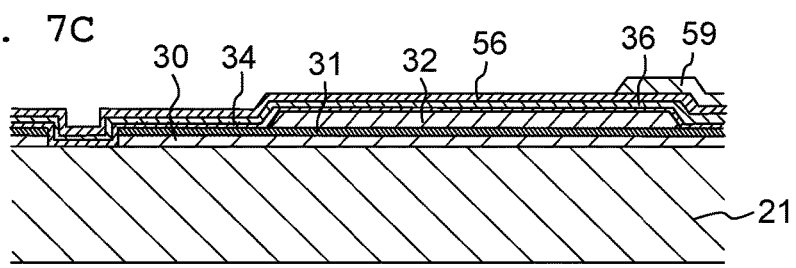
Figure 7D:
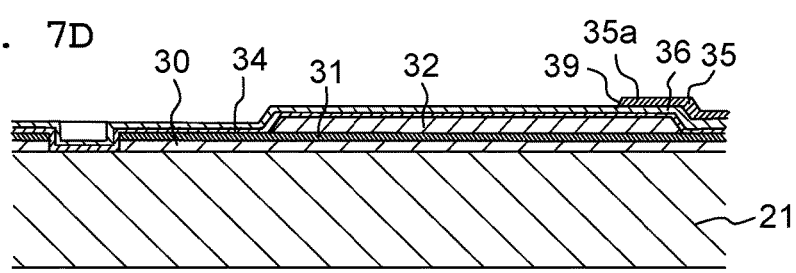

The wires 35 are formed in the following manner. First, as depicted in FIG. 7C, an electroconductive film 56 is formed on the entire area of the upper surface of the insulating film 36 by way of sputtering or the like. Next, the electroconductive film 56 is etched to form the wires 35. That is, as depicted in FIG. 7C, a photoresist pattern 59 is formed in the parts of the electroconductive film 56 to be remained (the parts to become the wires 35 later). Next, as depicted in FIG. 7D, such parts of the electroconductive film 56 as not covered by the resist pattern 59 are removed by way of dry etching or the like and, thereafter, the resist pattern 59 is removed. By virtue of this, the plurality of wires 35 is formed such that each one end portion thereof overlaps with an end portion of the piezoelectric film 32. Further, in this stage, as depicted in FIG. 4, the slopes are formed for the three lateral surfaces 39 of the end portion 35a of the wire 35. Further, after the electroconductive film 56 is etched to form the wires 35, the wires 35 may be heated by heating the flow passage formation portion 21 at a certain temperature or above (annealing treatment).

Figure 7E:
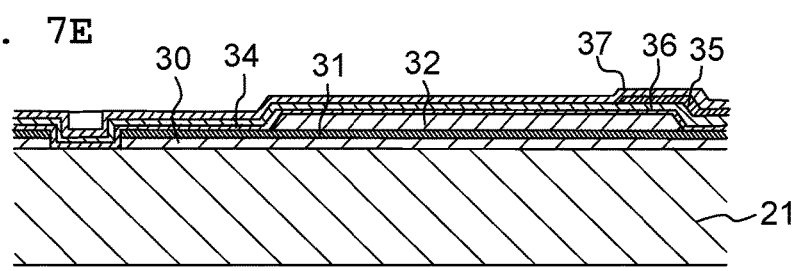

Next, as depicted in FIG. 7E, the second protective film 37 is formed to cover the plurality of wires 35. As with the previous insulating film 36, it is preferable to form the second protective film 37 made of silicon nitride ($SiN_x$) by way of the plasma CVD which is a high temperature process at 200° C. or above (preferably at 300° C. or above). Further, it is also possible to form the second protective film 37 by way of other film formation methods than the plasma CVD such as sputtering, atomic layer deposition (ALD), and the like.

Figure 8A:
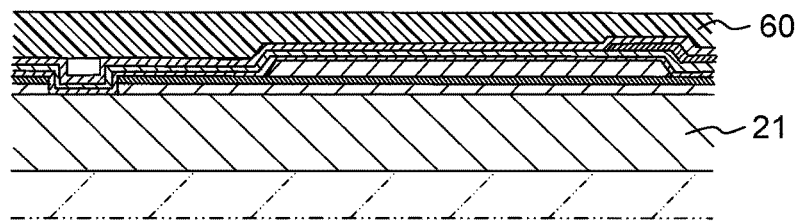

After the process is finished with the step of FIG. 7E, the next step is, as depicted in FIG. 8A, to remove the lower-side part (the far side from the vibration film 30) of the flow passage formation portion 21, in which the ink flow passages will be formed later on, so as to thin the same to a predetermined thickness (a thinning step). While the original silicon wafer, from which the flow passage formation portion 21 is formed, is as thick as approximately from 500 μm to 700 μm, the flow passage formation portion 21 is thinned to 100 μm or so through this thinning step.

It is possible to thin the flow passage formation portion 21 by way of abrasion using an abradant. In this stage as depicted in FIG. 8A, in order to hold the flow passage formation portion 21, a holding member 60 such as an adhesive tape of UV detachable type is attached to the piezoelectric actuator 22 under manufacturing, and then the lower portion of the flow passage formation portion 21 is abraded. If the thinning step of the flow passage formation portion 21 is finished, then the holding member 60 is detached from the piezoelectric actuator 22 under manufacturing. If an adhesive tape of UV detachable type is used as the holding member 60, then it is possible to detach the adhesive tape easily by irradiating the same with UV. Further, it is also possible to remove a part of the flow passage formation portion 21 to thin the same by way of other methods than the abrasion described above, such as cutting, etching, and the like.

Figure 8B:
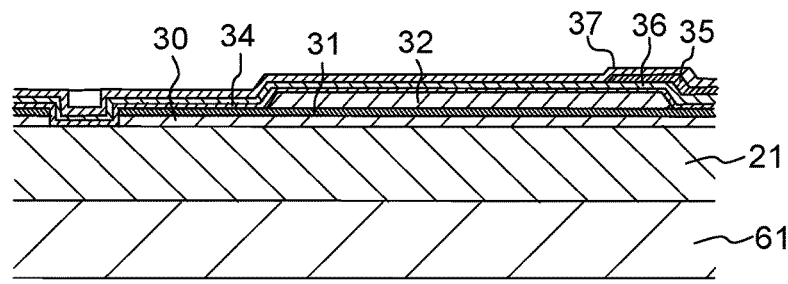

After the step of thinning the flow passage formation portion 21, the flow passage formation portion 21 is thinned. Therefore, if the flow passage formation portion 21 is left as it is, handling of the flow passage formation portion 21 is difficult in the following steps of manufacturing the piezoelectric actuator 22 and the like. Therefore, as depicted in FIG. 8B, after the thinning step, a supporting member 61 is attached to the lower surface of the thinned flow passage formation portion 21 on the side far from the vibration film 30. A glass wafer, for example, is used as the supporting member 61, and the supporting member 61 is joined to the flow passage formation portion 21 with an adhesive so as to be detachable later on.

Figure 8C:
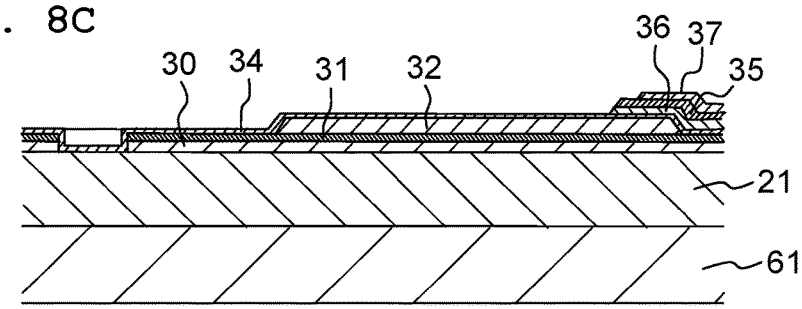
Figure 8D:
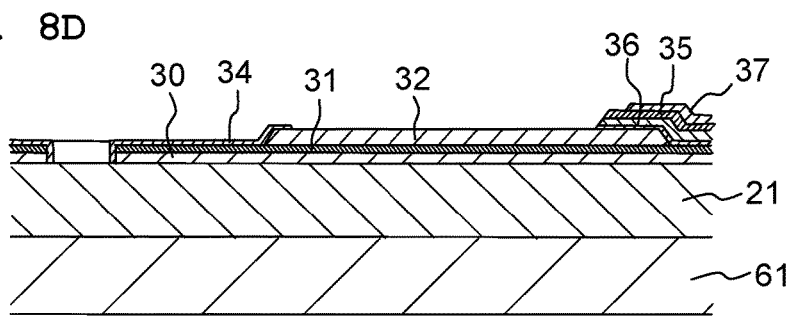

After attaching the supporting member 61, the remaining steps for manufacturing the piezoelectric actuator 22 are performed to finish the piezoelectric actuator 22. First, as depicted in FIG. 8C, in the areas where the wires 35 are not laid, the insulating film 36 and the second protective film 37 are removed by etching. Further, the insulating film 36 and the second protective film 37 may be removed from these areas by a single etching step. However, the insulating film 36 and the second protective film 37 may also be removed from these areas by different etching steps. Further, as depicted in FIG. 8D, such parts of the first protective film 34 that cover central portions of the piezoelectric films 32 are removed by etching.

Figure 9A:
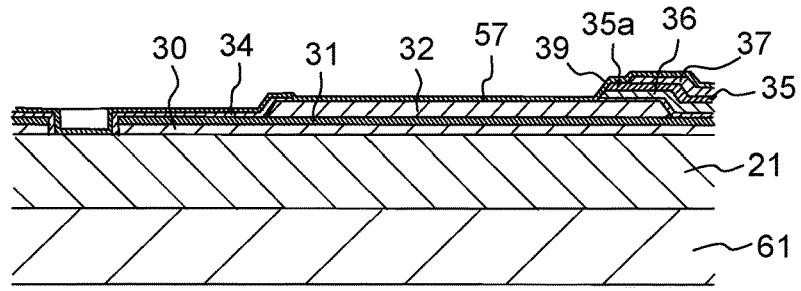
Figure 9B:
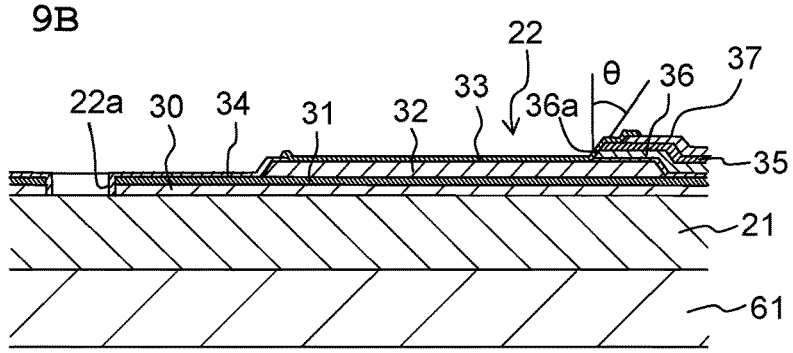

As depicted in FIG. 9A, the individual electrode 33 is formed in such an area of each of the piezoelectric films 32 as exposed from the first protective film 34. In particular, first, an electroconductive film 57 is formed on the first protective film 34 from the vibration film 30 to the plurality of piezoelectric films 32 by way of sputtering or the like. Next, as depicted in FIG. 9B, the electroconductive film 57 is etched to remain its parts covering the central portions of the piezoelectric films 32 but to remove its other parts. Further, each of the individual electrodes 33 is formed such that its end portion extends over from the central area of the piezoelectric film 32, across an end portion of the insulating film 36, up to the wire 35 on the insulating film 36. Further, the individual electrode 33 is formed to cover the three lateral surfaces 39 of the end portion 35a of the wire 35. By virtue of this, the individual electrode 33 and the wire 35 are conducted with each other on the upper surface of each of the piezoelectric films 32.

At this stage, when the insulating film 36 is removed by etching, in the step of removing the insulating film 36 (FIG. 8C), from the areas of the upper surfaces of the piezoelectric films 32 where the wires 35 are not formed, each of the end portions 36a of the insulating film 36 being unremoved but remained (see FIG. 4) is formed in such an inclined shape that the thickness thereof is decreased toward a leading end thereof. However, if the inclination angle θ of the end portion 36a of the insulating film 36 is small with respect to the direction orthogonal to the upper surface of the piezoelectric film 32, then the end face of the insulating film 36 becomes nearly a vertical plane. In this case, when forming the individual electrodes 33, it is less easy to form the electroconductive film 57 which will later become the individual electrodes 33. Therefore, as depicted in FIG. 9B, it is preferable for the above inclination angle θ of the insulating film 36 to be from 45 degrees to 75 degrees. By virtue of this, the electroconductive film 57 is reliably formed on the end portions 36a of the insulating film 36 such that any inadequate conduction is less likely to occur between the individual electrodes 33 and the wires 35.

When the above step of forming the individual electrodes 33 is ended, the manufacturing is finished with the piezoelectric actuator 22. In other words, in this embodiment, the step of forming the individual electrodes 33 is performed as the last step of manufacturing the piezoelectric actuator 22.

Figure 9C:
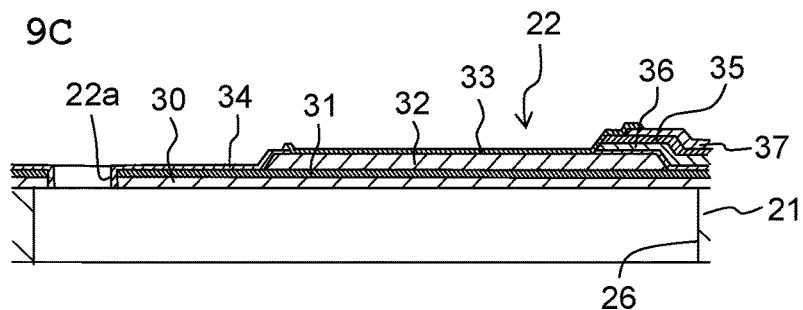
Figure 9D:
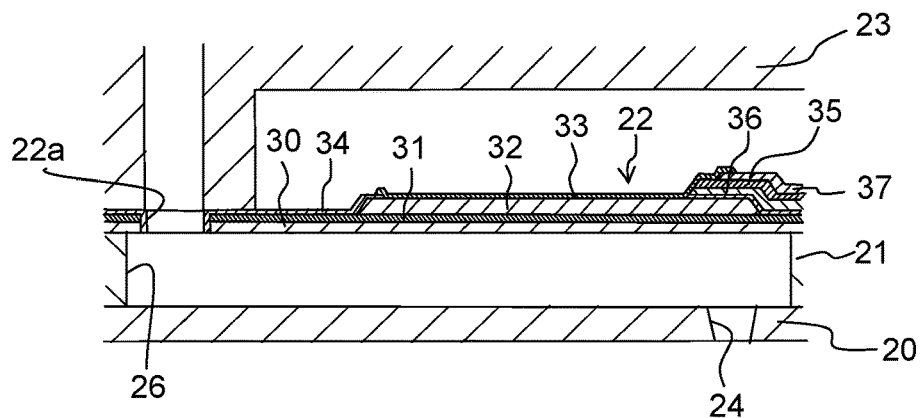

After the manufacturing is finished with the piezoelectric actuator 22, the supporting member 61 is removed from the flow passage formation portion 21. If the supporting member 61 is a glass wafer, for example, then a laser beam is radiated from the back side to detach and remove the supporting member 61 joined with the adhesive. Then, as depicted in FIG. 9C, the pressure chambers 26 are formed by etching the flow passage formation portion 21 from the lower side which is the far side from the vibration film 30. Further, as depicted in FIG. 9D, the nozzle plate 20 is joined onto the lower surface of the flow passage formation portion 21 by way of adhesive, and the reservoir formation member 23 is joined to the piezoelectric actuator 22 by way of adhesive or the like. A thermosetting adhesive is used to join the nozzle plate 20 and the reservoir formation member 23, and a heating temperature of a heater (not depicted) is set at 100° C. or so to heat and join the flow passage formation portion 21 and the piezoelectric actuator 22.

In the embodiment explained above, the step of forming the individual electrodes 33 depicted in FIG. 9A is the last step of manufacturing the piezoelectric actuator 22. In other words, the individual electrodes 33 are formed after the step of forming the insulating film 36 depicted in FIG. 7B, the step of forming the wires 35 depicted in FIG. 7C, the step of forming the second protective film 37 depicted in FIG. 7D, and the step of thinning the flow passage formation portion 21 depicted in FIG. 8A. By virtue of this, the following effects can be obtained.

(1) Forming the Individual Electrodes 33 after Forming the Wires 35

If the wires 35 to be connected to the individual electrodes 33 are formed after forming the individual electrodes 33 on the piezoelectric films 32, then the individual electrodes 33 are liable to be detached from the piezoelectric films 32 due to some stress generated in forming the wires 35. In particular, in the wire formation step of this embodiment, after the electroconductive film 56 is formed as depicted in FIG. 7C, the wires 35 are formed by etching the electroconductive film 56. In this stage of etching the electroconductive film 56, when the photoresist pattern is formed, such a step of heating the resist to harden is performed. On this occasion, however, because the electroconductive film 56 is also heated, a thermal stress is generated between the electroconductive film 56 and the layer superimposed thereon. Further, in a case of performing a heating step (annealing treatment) after forming the wires 35, the thermal stress is also generated. Therefore, if the wires 35 are formed after forming the individual electrodes 33, then the individual electrodes 33 are liable to be detached due to the thermal stress mentioned above. Further, the electroconductive film 56, which will later become the wires 35, is much thicker than the individual electrodes 33 (for example, the wires 35 are as thick as 1 μm while the individual electrodes 33 are as thick as 100 nm). Hence, the thermal stress generated during the heating of the electroconductive film 56 becomes larger.

Further, in this embodiment, first the electroconductive film 56 is formed entirely, and then the wires 35 are formed by removing the unnecessary parts of the electroconductive film 56 by means of etching. In this stage, if the individual electrodes 33 are formed prior to the formation of the wires 35, then when the electroconductive film 56 is etched as described above, the individual electrodes 33 are also liable to be removed along and thus reduced in film thickness.

In this regard, because the individual electrodes 33 are formed after forming the wires 35 in this embodiment, there is no occurring of such a problem that the individual electrodes 33 are detached from the piezoelectric films 32 or the individual electrodes 33 are thinned when the wires 35 are formed.

(2) Forming the Individual Electrodes 33 after Forming the Insulating Film 36

If the individual electrodes 33 are formed on the piezoelectric films 32 before forming the insulating film 36, then the individual electrodes 33 are more likely to be detached due to the stress generated in the step of forming the insulating film 36 and in the subsequent removing step by way of etching or the like. Especially, if the insulating film 36 is formed under a high temperature condition of 200° C. or above by way of the plasma CVD or the like, then the thermal stress generated between the piezoelectric films 32 and the individual electrodes 33 becomes larger such that detachment of the individual electrodes 33 is more likely to occur. In this regard, however, because the individual electrodes 33 are formed after forming the insulating film 36 in this embodiment, there is no occurring of such a problem that the individual electrodes 33 are detached due to the formation of the insulating film 36.

(3) Forming the Individual Electrodes 33 after Forming the Second Protective Film 37

The second protective film 37 is in a similar situation to the insulating film 36 described above in (2). That is, if the individual electrodes 33 are formed on the piezoelectric film 32 before forming the second protective film 37, then the individual electrodes 33 are more likely to be detached due to an internal stress of the piezoelectric films 32 generated in the step of forming the second protective film 37 and in the subsequent removing step by way of etching or the like. Further, if the second protective film 37 is also formed under a high temperature condition by way of the plasma CVD or the like, then detachment of the individual electrodes 33 are more likely to occur. In this regard, however, because the individual electrodes 33 are formed after forming the second protective film 37 in this embodiment, there is no occurring of such a problem that the individual electrodes 33 are detached due to the formation of the second protective film 37.

(4) Forming the Individual Electrodes 33 after the Step of Thinning the Flow Passage Formation Portion 21

As depicted in FIG. 8A, when the flow passage formation portion 21 is thinned, in order to prevent damaging the piezoelectric films 32 and the like, the holding member 60 such an adhesive tape is attached to the piezoelectric films 32. Hence, if the flow passage formation portion 21 is thinned after forming the individual electrodes 33, then the individual electrodes 33 are liable to be detached together with the holding member 60 when the holding member 60 is detached, because the holding member 60 is stuck to the individual electrodes 33. In this regard, however, the individual electrodes 33 are formed after the step of thinning the flow passage formation portion 21 is performed in this embodiment. That is, because the individual electrodes 33 have not yet been formed at the stage of the thinning step, there is no occurring of such a problem that the individual electrodes 33 are detached together with the holding member 60 when the holding member 60 is detached after the thinning step.

Further, after the step of thinning the flow passage formation portion 21, as depicted in FIG. 8B, the supporting member 61 attached to the flow passage formation portion 21. The supporting member 61 is joined easily by way of adhesive so as to be detachable later on. However, if there is a step to be performed under a high temperature condition after attaching the supporting member 61, then the supporting member 61 is liable to be disjoined due to the high heat. In this regard, however, in this embodiment, the flow passage formation portion 21 is thinned after forming the insulating film 36 (FIG. 7B) and forming the second protective film 37 (FIG. 7D) and, thereafter, the supporting member 61 is attached to the flow passage formation portion 21. Therefore, even as the insulating film 36 and the second protective film 37 are formed through a high temperature process such as the plasma CVD or the like, the supporting member 61 is joined thereafter. Thus, the supporting member 61 will not be disjoined due to the adhesive being heated to a high temperature after joining the supporting member 61.

(5) About the Temperature at the Time of Joining the Reservoir Formation Member 23 and the Like As depicted in FIG. 9D, after the step of forming the individual electrodes 33, the step of joining the nozzle plate 20 on the flow passage formation portion 21 with a thermosetting adhesive and the step of joining the reservoir formation member 23 on the piezoelectric actuator 22 with the thermosetting adhesive are performed. Because of the junction with the thermosetting adhesive, it is necessary to heat the flow passage formation portion 21 and the piezoelectric actuator 22 with a heater (not depicted). However, the heating temperature of the heater in those junction steps is lower than the processing temperature for the steps prior to the formation of the individual electrodes 33. For example, the heating temperature of the heater in the above junction steps is 100° C. or so, which is lower than the temperature for heating the flow passage formation portion 21 (200° C. or above; preferably 300° C. or above) when forming the insulating film 36 or the second protective film 37 by way of the plasma CVD or the like. Therefore, the heating with the heater in the above junction steps is not so much of the problem concerning the detachment of the individual electrodes 33.

In the embodiment explained above, the ink jet head 4 jetting the inks corresponds to the "liquid jetting apparatus" of the present teaching. The common electrode 31 positioned under the piezoelectric films 32 corresponds to "the first electrode" of the present teaching. The individual electrodes 33 positioned upon the piezoelectric films 32 correspond to "the second electrode" of the present teaching. The second protective film 37 covering the wires 35 corresponds to "the protective film" of the present teaching.

Next, a few modifications will be explained which apply various changes to the embodiment described above. However, the same reference numerals are assigned to the components having an identical or similar configuration to those in the abovementioned embodiment, and any explanation therefor will be omitted as appropriate.

In the above embodiment, the individual electrodes 33 are formed in the last step of the manufacturing of the piezoelectric actuator 22. However, the present teaching is not limited to such a manufacturing process.

Because a great influence is exerted on the exfoliation of each of the individual electrodes 33 by the steps of forming the electroconductive film 56, heating the photoresist and etching the electroconductive film 56 relating to formation of the wires 35, it is preferable to form the individual electrodes 33 after these steps. Conversely, the individual electrodes 33 may be formed at any timing after the wires 35 have been formed.

For example, after the wires 35 have been formed on the insulating film 36 (FIG. 7D) and before forming the second protective film 37 to protect the wires 35, the individual electrodes 33 may be formed at positions of the piezoelectric films 32 exposed by etching the first protective film 34 and the insulating film 36. Alternatively, the step of thinning the flow passage formation portion 21 (FIG. 8A) may be performed after finishing the step of forming the individual electrodes 33 on the piezoelectric films 32.

In the above embodiment, the wires 35 are formed (FIGS. 7C and 7D) through the steps of forming the electroconductive film 56 for the wires 35, forming the photoresist pattern, and patterning the electroconductive film 56 by way of etching. However, it is also possible to form the wires 35 through other steps than the above.

Figure 10A:
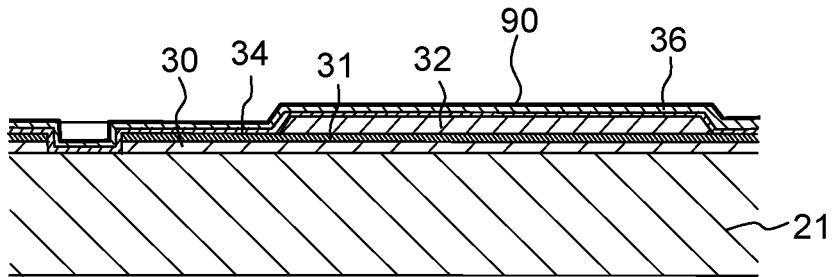
FIGS. 10A to 10D are explanatory diagrams of a step of forming wires in accordance with a modification.
Figure 10B:
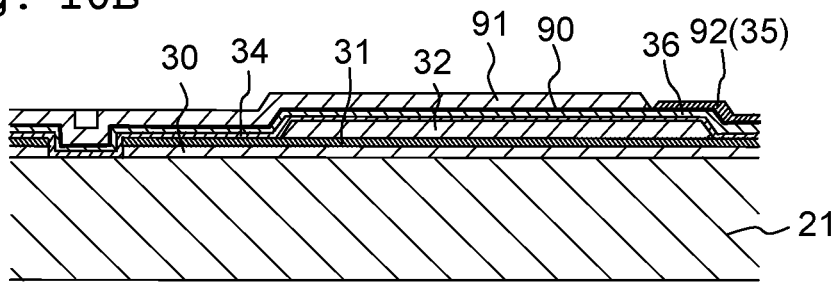
Figure 10C:
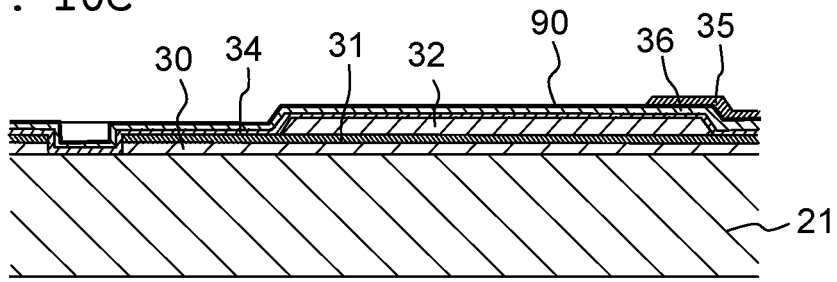
Figure 10D:
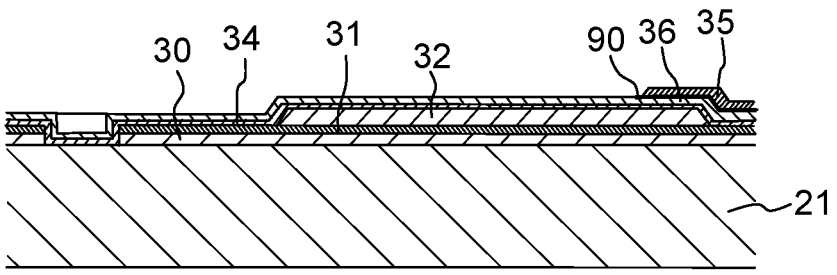

As depicted in FIG. 10A, first, a seed layer 90 is formed on the insulating film 36 as a film of chromium (Cr), nickel (Ni), titanium (Ti), copper (Cu), or the like. Next, as depicted in FIG. 10B, after forming a resist pattern 91 on the seed layer 90, an electroconductive film 92 of gold is formed thereon by way of plating. On this occasion, the electroconductive film 92 is formed only in the area which is not covered by the resist pattern 91 and from which the seed layer 90 is exposed. Then, as depicted in FIG. 10C, the wires 35 are formed by removing the resist pattern 91. Further, as depicted in FIG. 10D, the wires 35 of gold are used as a mask for removing such parts of the seed layer 90 as uncovered by the wires 35 by way of dry etching.

In this stage, if the above wire formation step is performed after forming the individual electrodes 33, then the individual electrodes 33 are liable to be exfoliated and/or reduced in film thickness. First, if the individual electrodes 33 are present under the seed layer 90 when the seed layer 90 is removed by way of etching as depicted in FIG. 10D, then the individual electrodes 33 may also be removed along and thus reduced in thickness. Further, depending on the material of the seed layer 90, a thermal stress may be generated between the seed layer 90 and the layer superimposed thereon due to the heating during formation of the resist pattern 91. If the individual electrodes 33 are present under the seed layer 90, then the individual electrodes 33 are liable to be exfoliated due to the above thermal stress.

In this regard, if the individual electrodes 33 are formed after forming the wires 35, then there is no occurring of such problems that the individual electrodes 33 are exfoliated from the piezoelectric films 32 or the individual electrodes 33 are reduced in film thickness when the wires 35 are formed.

The piezoelectric actuator 22 is not limited to the configuration explained in the above embodiment, but can be changed appropriately as exemplified below.

In the above embodiment, the insulating film 36 is formed between the first protective film 34 and the wires 35. However, the insulating film 36 may be omitted in cases where it is possible to secure a sufficient insulation between the wires 35 and the common electrode 31 with the first protective film 34 alone. Alternatively, the first protective film 34 covering the piezoelectric films 32 may also be omitted. Further, the second protective film 37 covering the wires 35 may also be omitted.

The embodiment and its modifications explained above have applied the present teaching to an ink jet head configured to print images and the like by jetting ink to a recording paper. However, it is also possible to apply the present teaching to any liquid jetting apparatuses used for various purposes other than printing images and the like. For example, it is also possible to apply the present teaching to liquid jetting apparatuses which jet an electroconductive liquid to a substrate to form an electroconductive pattern on a surface of the substrate.

Next, an explanation will be made on the disclosed teaching other than the teaching according to the claims 1 to 12 set forth in the original claims.

That is, the disclosed teaching is related to a method for manufacturing a liquid jetting apparatus provided with: a flow passage formation portion in which a pressure chamber is formed to communicate with a nozzle; and a piezoelectric actuator having a vibration film provided on the flow passage formation portion to cover the pressure chamber, a piezoelectric film arranged on the vibration film to correspond to the pressure chamber, a first electrode arranged on a surface of the piezoelectric film on a side near to the vibration film, a second electrode arranged on another surface of the piezoelectric film on a side far from the vibration film, and a wire connected to the second electrode, the method including: a thinning step of thinning the flow passage formation portion by removing a part of the flow passage formation portion on a side far from the vibration film, wherein after the thinning step, an electrode formation step is performed to form the second electrode on the surface of the piezoelectric film on the side far from the vibration film.

While the disclosed teaching mentioned above corresponds to claim 3 in the original claims, the technical scope of the disclosed teaching mentioned above includes teachings which do not premise the configuration of claim 1 referred by original claim 3. That is, it includes the aspect of forming the second electrode first and then forming the wire.

Figure 11A:
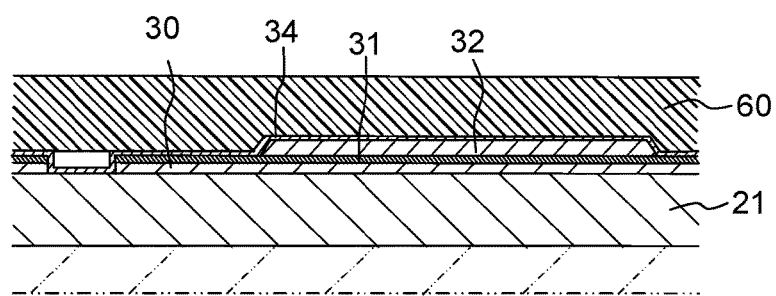
FIGS. 11A and 11B depict steps of manufacturing an ink jet head in accordance with another modification.
Figure 11B:
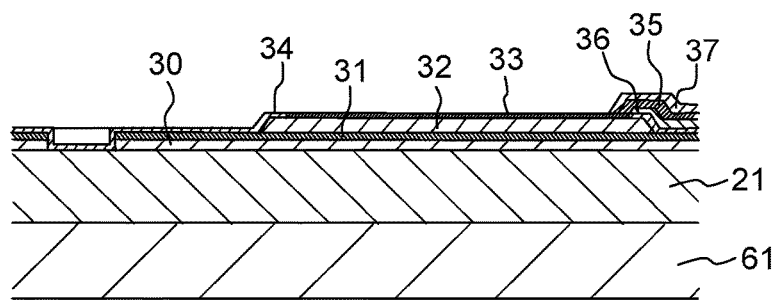

Next, an explanation will be made below on an exemplary embodiment of the disclosed teaching mentioned above. First, as depicted in FIG. 11A, on the flow passage formation portion 21, the vibration film 30, the common electrode 31, the piezoelectric films 32, and the first protective film 34 are formed. In this stage, the manufacturing of the piezoelectric actuator 22 is once suspended, and the holding member 60 such as an adhesive tape is attached to the piezoelectric actuator 22 under manufacturing. Then, the lower part of the flow passage formation portion 21 is removed by way of abrasion or the like to thin the flow passage formation portion 21. After this thinning step is finished, as depicted in FIG. 11B, the holding member 60 is detached and the supporting member 61 is joined to the flow passage formation portion 21. Thereafter, the manufacturing of the piezoelectric actuator 22 is restarted. That is, the insulating film 36, the wires 35, the second protective film 37 and the individual electrodes 33 are formed respectively after the first protective film 34 is etched. Here, as in the embodiment described earlier on, the individual electrodes 33 may be formed after the wires 35 are formed. However, as depicted in FIG. 11B, it is also possible to first form the individual electrodes 33, and then form the insulating film 36, the wires 35, and the second protective film 37, so that end portions of the wires overlap with the individual electrodes 33.

What is claimed is:

1. A method for manufacturing a liquid jetting apparatus; wherein the liquid jetting apparatus includes:
    a flow passage formation portion in which a pressure chamber is formed to communicate with a nozzle; and
    a piezoelectric actuator having:
        a vibration film provided on the flow passage formation portion to cover the pressure chamber;
        a piezoelectric film arranged on the vibration film to correspond to the pressure chamber;
        a first electrode arranged on a surface of the piezoelectric film on a side near to the vibration film;
        a second electrode arranged on another surface of the piezoelectric film on a side far from the vibration film; and
        a wire connected to the second electrode;
    wherein the method comprises:
        a wire formation step of forming the wire so that a part of the wire overlaps with the piezoelectric film; and
        an electrode formation step of forming the second electrode, after the wire formation step, on another surface of the piezoelectric film on the side far from the vibration film so as to be in electrical conduction with the wire; and
        a heating step after the wire formation step and before the electrode formation step.

2. The method according to claim 1;
wherein, in the wire formation step, a step of heating a resist to form a photoresist pattern is performed before the dry etching.

3. The method according to claim 2;
wherein the wire is thicker than the second electrode.

4. The method according to claim 1;
wherein in the wire formation step, the wire is formed by forming an electroconductive film to cover the vibration film and the piezoelectric film, and then removing a part of the electroconductive film by dry etching.

5. A method for manufacturing a liquid jetting apparatus; wherein the liquid jetting apparatus includes:
    a flow passage formation portion in which a pressure chamber is formed to communicate with a nozzle; and
    a piezoelectric actuator having:
        a vibration film provided on the flow passage formation portion to cover the pressure chamber;
        a piezoelectric film arranged on the vibration film to correspond to the pressure chamber;
        a first electrode arranged on a surface of the piezoelectric film on a side near to the vibration film;
        a second electrode arranged on another surface of the piezoelectric film on a side far from the vibration film; and
        a wire connected to the second electrode;
    wherein the method comprises:
        a wire formation step of forming the wire so that a part of the wire overlaps with the piezoelectric film;
        an electrode formation step of forming the second electrode, after the wire formation step, on another surface of the piezoelectric film on the side far from the vibration film so as to be in electrical conduction with the wire; and
        a thinning step of thinning the flow passage formation portion by removing a part of the flow passage formation portion on a side far from the vibration film;
    wherein in the wire formation step, the wire is formed by forming an electroconductive film to cover the vibration film and the piezoelectric film, and then removing a part of the electroconductive film by etching; and
    wherein the electrode formation step is performed after the thinning step.

6. A method for manufacturing a liquid jetting apparatus; wherein the liquid jetting apparatus includes:
    a flow passage formation portion in which a pressure chamber is formed to communicate with a nozzle; and
    a piezoelectric actuator having:
        a vibration film provided on the flow passage formation portion to cover the pressure chamber;
        a piezoelectric film arranged on the vibration film to correspond to the pressure chamber;
        a first electrode arranged on a surface of the piezoelectric film on a side near to the vibration film;
        a second electrode arranged on another surface of the piezoelectric film on a side far from the vibration film; and
        a wire connected to the second electrode;
    wherein the method comprises:
        a wire formation step of forming the wire so that a part of the wire overlaps with the piezoelectric film;
        an electrode formation step of forming the second electrode, after the wire formation step, on another surface of the piezoelectric film on the side far from the vibration film so as to be in electrical conduction with the wire; and
        a protective film formation step of forming a protective film for covering the wire after the wire formation step;
    wherein in the wire formation step, the wire is formed by forming an electroconductive film to cover the vibration film and the piezoelectric film, and then removing a part of the electroconductive film by etching; and wherein the electrode formation step is performed after the protective film formation step.

7. The method according to claim 6;
wherein in the protective film formation step, the protective film is formed at a temperature condition of 200° C. or above.

8. The method according to claim 6, further comprising:
a thinning step of thinning the flow passage formation portion by removing a part of the flow passage formation portion on a side far from the vibration film after the protective film formation step; and
a supporting member attaching step of attaching a supporting member to a surface of the flow passage formation portion on the side far from the vibration film after the thinning step;
wherein the electrode formation step is performed after the supporting member attaching step.

9. A method for manufacturing a liquid jetting apparatus;
wherein the liquid jetting apparatus includes:
a flow passage formation portion in which a pressure chamber is formed to communicate with a nozzle; and
a piezoelectric actuator having:
a vibration film provided on the flow passage formation portion to cover the pressure chamber;
a piezoelectric film arranged on the vibration film to correspond to the pressure chamber;
a first electrode arranged on a surface of the piezoelectric film on a side near to the vibration film;
a second electrode arranged on another surface of the piezoelectric film on a side far from the vibration film; and
a wire connected to the second electrode;
wherein the method comprises:
a wire formation step of forming the wire so that a part of the wire overlaps with the piezoelectric film;
an electrode formation step of forming the second electrode, after the wire formation step, on another surface of the piezoelectric film on the side far from the vibration film so as to be in electrical conduction with the wire; and
an insulating film formation step of forming an insulating film to cover the vibration film and the piezoelectric film; and
wherein the wire formation step is performed after the insulating film formation step to form the wire on the insulating film such that a part of the wire covers the piezoelectric film.

10. The method according to claim 9;
wherein in the insulating film formation step, the insulating film is formed under a temperature condition of 200° C. or above.

11. The method according to claim 10, further comprising:
a thinning step of thinning the flow passage formation portion by removing a part of the flow passage formation portion on a side far from the vibration film after the insulating film formation step; and
a supporting member attaching step of attaching a supporting member to a surface of the flow passage formation portion on the side far from the vibration film after the thinning step;
wherein the electrode formation step is performed after the supporting member attaching step.

12. The method according to claim 9;
wherein in the insulating film formation step, the insulating film is formed to cover the entire piezoelectric film;
wherein the method further comprises an insulating film removal step of removing the insulating film from a partial area of the piezoelectric film located on the surface on the side opposite to the vibration film;
wherein in the insulating film removal step, an end portion of a part of the insulating film to be unremoved but remained is formed into a shape inclined at an angle of 45 to 75 degrees with respect to a direction orthogonal to the surface of the piezoelectric film on the side far from the vibration film, so that thickness thereof is decreased toward a leading end thereof; and
wherein in the electrode formation step, the second electrode is formed to extend from the partial area of the piezoelectric film via the inclined end portion of the insulating film up to the wire on the insulating film.

* * * * *